United States Patent
Elshaer et al.

(10) Patent No.: US 10,266,060 B2
(45) Date of Patent: Apr. 23, 2019

(54) SS-L WIRELESS POWER TRANSFER COMPENSATION CIRCUIT

(71) Applicant: Ford Global Technologies, LLC, Dearborn, MI (US)

(72) Inventors: Mohamed Elshaer, Canton, MI (US); Nevin Altunyurt, Ann Arbor, MI (US); Richard William Kautz, North Branch, MI (US); Hadi Malek, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 189 days.

(21) Appl. No.: 15/047,868

(22) Filed: Feb. 19, 2016

(65) Prior Publication Data
US 2017/0240056 A1    Aug. 24, 2017

(51) Int. Cl.
*H02J 50/10* (2016.01)
*B60L 11/18* (2006.01)
*H03H 7/38* (2006.01)

(52) U.S. Cl.
CPC ............ *B60L 11/182* (2013.01); *H02J 50/10* (2016.02); *H03H 7/38* (2013.01)

(58) Field of Classification Search
CPC ....................................... H02J 50/10
USPC ....................................... 320/108
See application file for complete search history.

(56) References Cited

U.S. PATENT DOCUMENTS

| | | | |
|---|---|---|---|
| 8,094,467 B2 | 1/2012 | Wang | |
| 9,054,542 B2 | 6/2015 | Baarman | |
| 2011/0074219 A1* | 3/2011 | Villa Gazulla | H02J 5/005 307/104 |
| 2013/0200721 A1* | 8/2013 | Kurs | H04B 5/0037 307/104 |
| 2013/0271222 A1 | 10/2013 | Choi et al. | |
| 2013/0301308 A1 | 11/2013 | Hosotani | |
| 2015/0015197 A1* | 1/2015 | Mi | B60L 11/182 320/108 |
| 2015/0244248 A1* | 8/2015 | Knoedgen | H05B 33/0815 315/223 |
| 2016/0006270 A1* | 1/2016 | Hosotani | H01F 5/00 307/104 |
| 2016/0072299 A1* | 3/2016 | Huang | H02J 5/005 307/104 |

(Continued)

FOREIGN PATENT DOCUMENTS

CN    204243917 U    4/2015

OTHER PUBLICATIONS

Siqi, Li, et al., A Double-Sided LCC Compensation Network and Its Tuning Method for Wireless Power Transfer, DOI 10.11109/TVT.2014.2347006, IEEE Transactions on Vehicular Technology, 2013, 12 pgs.

*Primary Examiner* — Suchin Parihar
(74) *Attorney, Agent, or Firm* — David B. Kelley; Brooks Kushman P.C.

(57) ABSTRACT

A secondary side wireless power transfer compensation circuit includes a secondary coil, a capacitor in series with the secondary coil, and an inductor in parallel with the secondary coil and capacitor. The inductor has an impedance matching a reflected impedance of a load electrically connected thereacross such that the secondary coil achieves resonance with a primary coil coupled therewith at a predetermined frequency that depends on the impedance.

16 Claims, 10 Drawing Sheets

(56) References Cited

U.S. PATENT DOCUMENTS

| | | | |
|---|---|---|---|
| 2016/0094048 A1* | 3/2016 | Bae | H02J 50/12 |
| | | | 307/104 |
| 2016/0187519 A1* | 6/2016 | Widmer | G01V 3/10 |
| | | | 324/222 |
| 2017/0118549 A1* | 4/2017 | Ganem | H04R 1/1025 |
| 2018/0138756 A1* | 5/2018 | Bae | H02J 50/60 |

* cited by examiner

SS-L WIRELESS POWER TRANSFER COMPENSATION CIRCUIT

TECHNICAL FIELD

This disclosure relates to compensation circuit topologies for wireless power transfer circuits.

BACKGROUND

During wireless power transfer (WPT), energy is transferred through mutual inductance of transmitting and receiving coils. Because of the gap between the transmitting and receiving coils, the coupling coefficient between the two coils can be small (5% to 30%) depending on distance, alignment and size of the coils. This can cause WPT systems to have large leakage inductance and small mutual inductance. Compensation circuits including capacitors are typically used to cancel such leakage inductance by tuning the coils working at resonant frequency.

SUMMARY

A vehicle includes an inductor in parallel with a load and a series connected secondary coil and capacitor, and having an impedance such that the secondary coil achieves resonance at a predetermined frequency with a primary coil during wireless power transfer. The primary coil forms a portion of a primary charge circuit including a capacitor in series with the primary coil. The impedance is such that an input impedance to the primary charge circuit is inductive at the predetermined frequency.

A secondary side wireless power transfer compensation circuit includes a secondary coil, a capacitor in series with the secondary coil, and an inductor in parallel with the secondary coil and capacitor. The inductor has an impedance matching a reflected impedance of a load electrically connected thereacross such that the secondary coil achieves resonance with a primary coil coupled therewith at a predetermined frequency that depends on the impedance.

A vehicle includes a secondary coil, a capacitor, and an inductor arranged such that, during wireless power transfer from a primary coil to the secondary coil, the secondary coil, capacitor, and inductor form a portion of a SS-L compensation network. The vehicle also includes a traction battery configured to receive power from the secondary coil, and an electric machine configured to receive power from the traction battery.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments.

As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
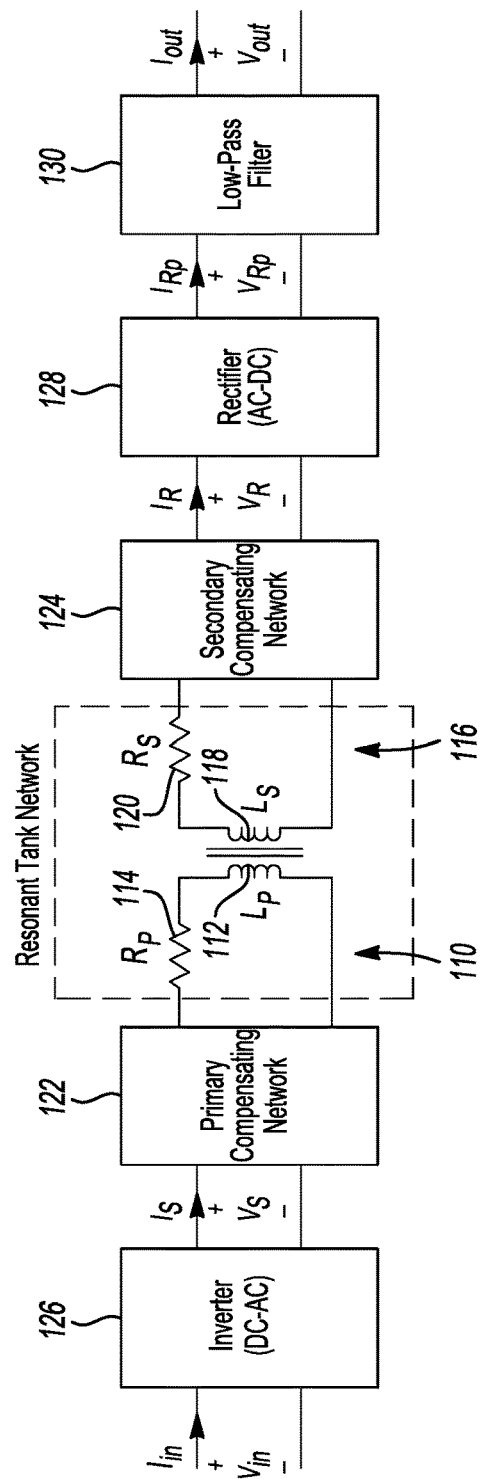
FIG. 1 is a schematic diagram of an inductive power transfer system.

Inductive power transfer (IPT) utilizes magnetic coupling to transfer power from a stationary primary source to a secondary load over an air gap. Resonant circuits are used to enhance the efficiency of power transmission between transmitter and receiver coils. By adopting resonant circuits in the IPT system, inductive power transfer at medium to high power levels can be achieved over a range of distances. FIG. 1 shows typical circuitry needed to create an alternating field, or so called flux, in a transmitter coil 110, represented by inductor 112 and resistor 114, and convert that flux into electric current into a receiver coil 116, represented by inductor 118 and resistor 120. Respective reactive circuits 122, 124, also referred to as compensation networks, are connected to each of the coils 110, 116 to operate the loosely coupled coils 110, 116 at resonance. An inverter 126 is used to supply AC voltage waveform to the resonant tank. The switches of the inverter 126 are controlled based on a modulation signal that is derived by various methods; phase-shift and frequency control being some of the commonly used approaches to control the on/off states of the inverter switches. In addition, some designs control the IPT DC input voltage to improve efficiency and ensure satisfaction of load power over the gamut of system specifications. Lastly, the AC voltage at the resonant tank's secondary side is rectified via rectifier 128 and filtered via (low-pass) filter 130 to supply a controlled DC voltage to a battery.

While there are many ways to control the inverter switches, frequency control is typically the control method of choice. Although the other mentioned methods have benefits, their disadvantages limit their employment in the IPT system. DC-link voltage control, for example, requires an additional conversion stage before the IPT system to control its input voltage—thus increasing its cost. In practical applications, the maximum power supplied by the inverter 126 is limited by parasitic losses of the inverter switches. Since the inverter 126 is loaded by a resonant tank, it benefits from the sinusoidal nature of its current and voltage. The switches can achieve zero voltage switching (ZVS) if the resonant tank input impedance appears inductive at the switched frequency.

Phase-shift control does not guarantee ZVS operation at small phase-shift angles, especially at light loads. High switching losses resulting from reverse recovery of the anti-parallel diodes may occur if there is not enough energy stored in the resonant inductor to discharge the switches parasitic capacitances. Additionally, the reduction of inverter output voltage amplitude requires higher primary current to deliver the same amount of power to the load, which increases conduction losses in the switches and resonant circuits. This problem is prevalent at low phase-shifted angles because the MOSFETs' body diodes conduct for the majority of the time. Both of these scenarios reduce the efficiency of the IPT system. For these reasons, the control method which is typically used for IPT systems maintains a constant phase shift of 180 degrees of the bridge legs and tunes the switching frequency to control the output power and operate in the region where the inverter load is inductive. This control methodology is referred to as frequency control.

Variation in the coils' self-inductance could potentially limit power transfer to the load. The underbody aluminum plate has an influence on the R-GA coil's self-inductance, especially at small distances. Similarly, the R-GA coil's ferrite plate has an influence on the M-VA coil's self-inductance. Some couplers exhibit large variation in self-inductance of more than 19%. Tuning these couplers with a simple compensation network, such as the series compensated primary and secondary network (SS compensation network), may not work because the switching frequency exceeds the allowed bandwidth. The allowed switching frequency bandwidth, defined by SAE, is 81.38 kHz to 90 kHz. Hence, it is required to satisfy power transfer for the input voltage range and coupling coefficient variations while switching the inverter switches within this specified regularity bandwidth.

Figure 2:
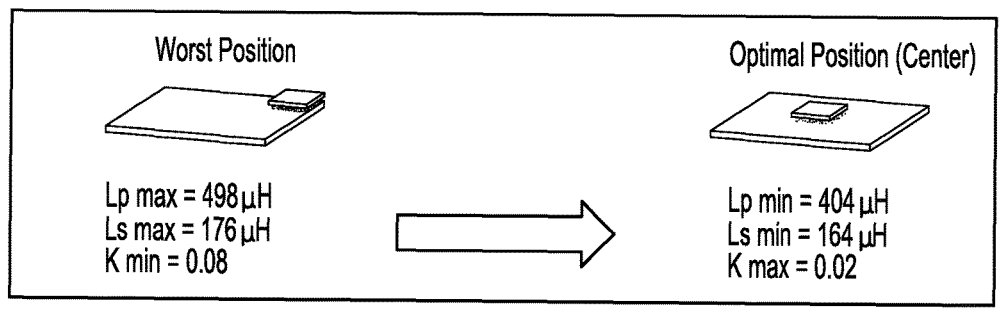
FIG. 2 provides a summary of specifications for example couplers.

Exemplary couplers are used to illustrate the bandwidth limitation issue when using the SS compensation network. Coupler specifications are summarized in FIG. 2. It would be beneficial to examine how the switching frequency varies as the coupling coefficient changes from its minimum value (0.08) to its maximum value (0.2). Assuming lossless coils, a generalized analytical expression for power transfer is given in equation (1):

$$P_{in}(f_s) = \frac{8V_{in}^2 \cos(\varphi_s)}{\pi^2 |Z_{in}|} \quad (1)$$

At maximum input voltage, the switching frequency is expected to be at its maximum given that the coupling coefficient is not changed.

Figure 3:
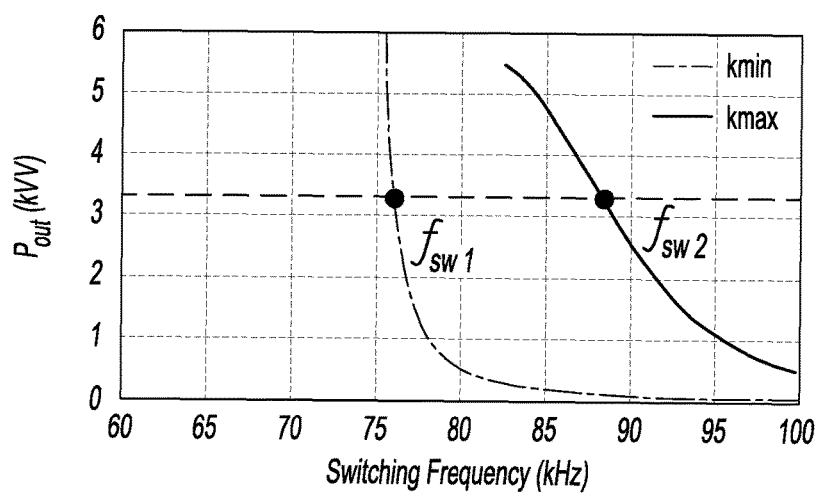
FIG. 3 is a plot of output power as a function of switching frequency.

Since the input impedance is a complex expression and general deductions cannot easily be made by inspection, the wireless power transfer (WPT) for this design is plotted as a function of frequency in FIG. 3. The system is operated at 400 V input voltage. Values for Cp and Cs are 8.86 nF and 21 nF, respectively. Operation at the minimum coupling coefficient allows for transferring a wide range of power at a sparser switching frequency range. In contrast, operation at the maximum coupling coefficient requires a wider range of switching frequencies to satisfy the same range of power as the minimum coupling case. Although operation under fixed coupling may satisfy the load power while operation within the regulatory bandwidth, changing the coupling coefficient does not permit operation within the allowed bandwidth.

Figure 4:
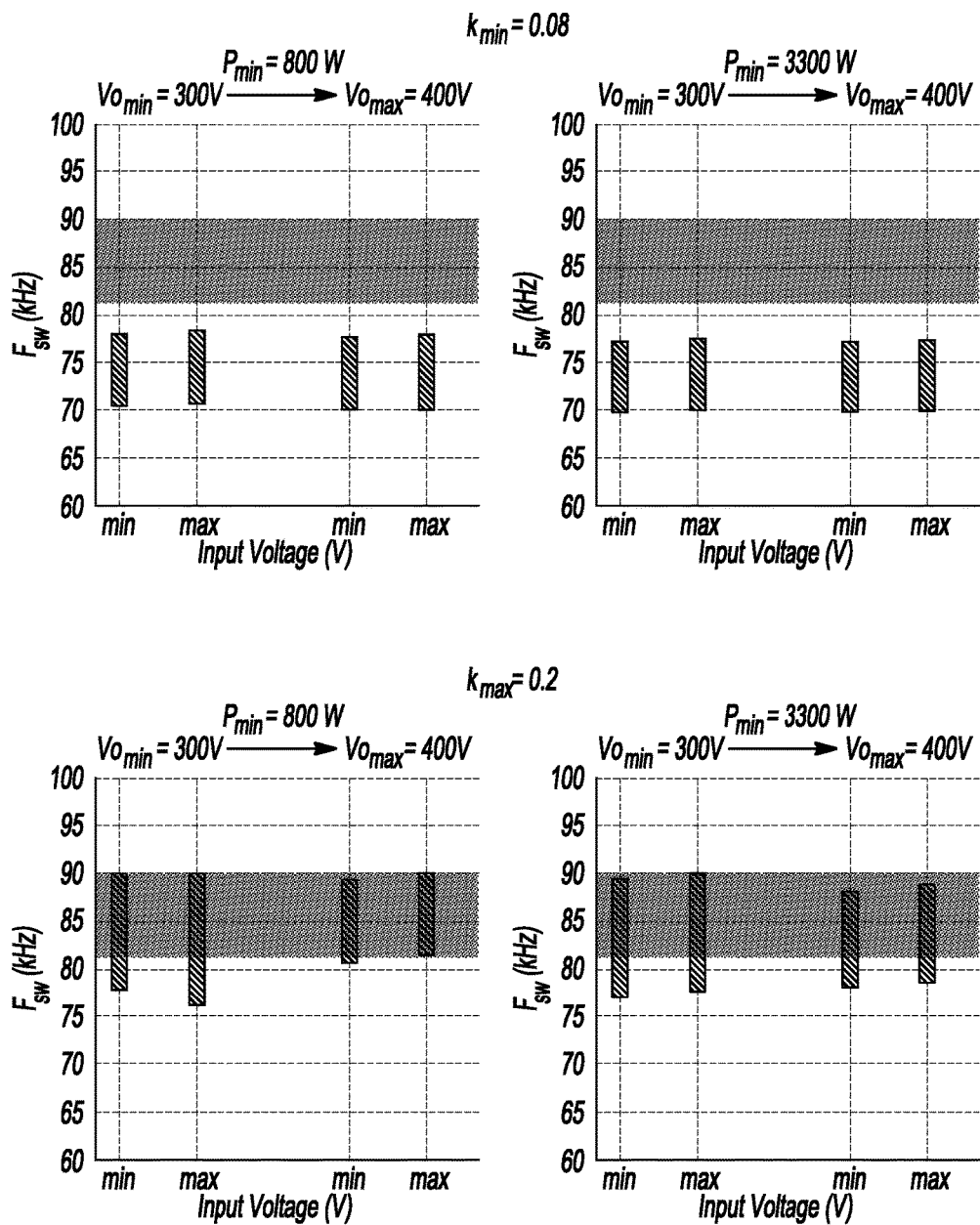
FIG. 4 shows plots of switching frequency as a function of input voltage associated with a series compensated primary and secondary network (SS compensation network) at a minimum power of 800 W and a maximum power of 3,300 W for a kmin of 0.08 and a kmax of 0.2.
Figure 5:
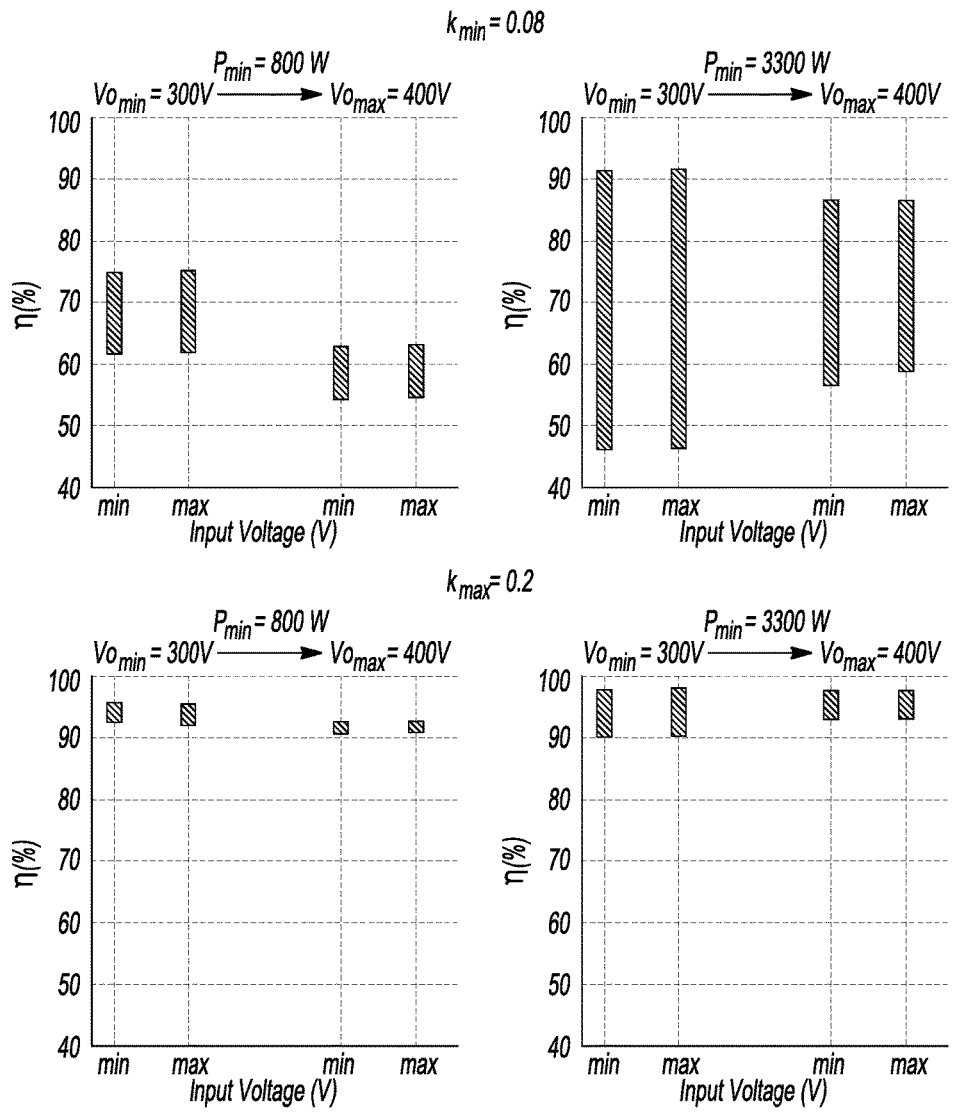
FIG. 5 shows plots of coupler efficiency as a function of input voltage associated with a SS compensation network at a minimum power of 800 W and a maximum power of 3,300 W for a kmin of 0.08 and a kmax of 0.2.

In order to prove that the deductions made in FIG. 3 are generalized for the SS compensation network, all possible combinations for a practical range of Cp and Cs were considered and evaluated for a predefined set of system specifications. FIG. 4 summarizes the switching frequency ranges for the exemplary couplers. When using the SS compensation network (FIG. 5), the system exceeds the allowed bandwidth for the minimum coupling coefficient case. All possible solutions for the switching frequency are below 80 kHz for the kmin condition. Though at high coupling coefficient, a majority of the designs fall within the regulatory bandwidth. Moreover at high coupling coefficient, coupler efficiency for all designs is above 90%. This indicates that the minimum coupling coefficient case has to be used as the main design constraint. As shown in FIG. 5, the efficiency range at full load can vary from 47% to 92% depending on the chosen design. It may be important that a design is selected to achieve high efficiency for the kmin case.

Figure 6:
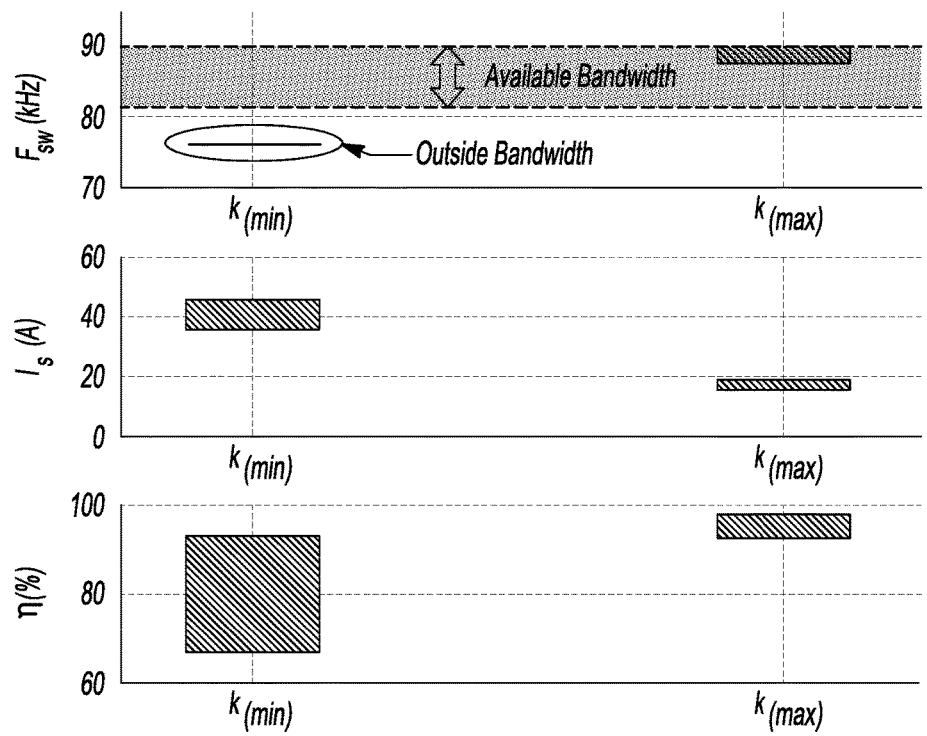
FIG. 6 shows plots of coupler efficiency, primary coil current, and switching frequency associated with a SS compensation network for kmin and kmax values.

FIG. 6 shows a more detailed characterization when tuning at 82.6 kHz. The switching frequency at maximum coupling is within the available bandwidth and system efficiency is greater than 90%. However, as expected the system cannot transfer power at the minimum coupling since the switching frequency range exceeds the bandwidth. Furthermore, current in the primary coil (Is) is greater than 40 A for the minimum coupling case. If efficiency is not the limiting factor, EMF levels would definitely be the limiting factor. As such, it is not feasible to use the SS compensation network for these coupler specifications.

Figure 7:
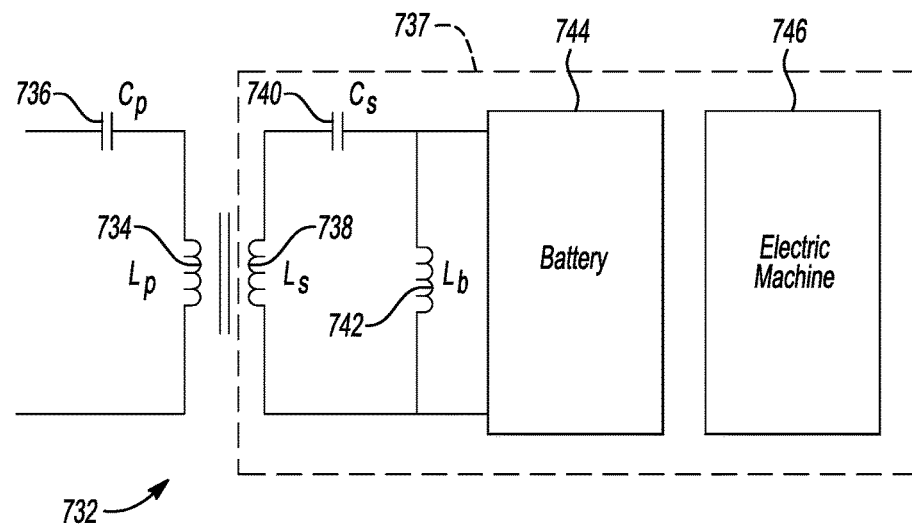
FIG. 7 is a schematic diagram of a series compensated primary and secondary-with-inductor network (SS-L compensation network).

Although the SS compensation network is the simplest and most cost effective, it cannot be used when a narrow variation in switching frequency is required to regulate the output voltage for a wide change in load as explained above. In order to directly connect the IPT system to a battery and charge it while tolerating variations in coupling and coil self-inductance, a new topology may be required. Several solutions have been proposed in the past. The LCL, for example, is a common one of the solutions. This topology, however, has a high part count. In order to achieve similar performance as the LCL, a new compensation network is proposed. It is referred to herein as a series compensated primary and secondary-with-inductor network (SS-L compensation network) and its schematic circuitry 732 is shown in FIG. 7 within the context of a vehicle charging scenario. The primary side of the circuitry 732 includes a primary coil 734 in series with a capacitor 736. Power from a source (not shown) is supplied to the primary side for wireless transfer to the secondary side, shown within a vehicle 737. The secondary side of the circuitry 732 includes a secondary coil 738 in series with a capacitor 740. Relative to a SS compensation network, the circuitry 732 has one additional part: an inductor 742 is added in the secondary side after the secondary compensation network and in parallel with the reflected load impedance (in parallel with the series connected secondary coil 738 and capacitor 740). The secondary side in this example is electrically connected with a traction battery 744 arranged to provide power to an electric machine 746. And, the electric machine 746 is arranged to provide power to move wheels (not shown) of the vehicle 737. This topology exhibits unexpected improved performance over the SS compensation network.

In order to operate two loosely coupled coils at resonance, two capacitors are required to tune them. At least one capacitor has to be connected at each side. Provided that only two capacitors are used to tune the coils, there are only two ways to connect each of these capacitors to a coil: the capacitor can be connected in parallel or in series. Such implementation is common and cost effective. The SS compensation network is the most suitable for the mentioned coupler specifications. It was revealed above that at low coupling the power transfer to the load was limited. In addition, the switching frequency range required to regulate the output voltage for the power range was too large and exceeded the system bandwidth. By adding the inductor 742 in parallel with the reflected load impedance, the switching frequency range is surprisingly narrower. The inductor 742, however, should have impedance equal to or less than the reflected load impedance at the operating switching frequency range. For example, if the inductance for the inductor 742 is selected to be 40 μH, then its impedance is approximately 15 Ω around the switching frequency bandwidth. Although the reflected load impedance at the output of the tank is approximately 30 Ω, current is expected to divide between the load and the inductor 742. Hence by optimizing the primary and secondary compensation capacitors 736, 740 while accounting for the impedance of the inductor 742, a compensation network for the coils 734, 738 can be designed to minimize the VA rating of the system. Since current is shared between the inductor 742 and load, the switching frequency is less dependent on load variations. Furthermore, by circulating more current in the secondary side, the IPT input voltage does not need to increase to satisfy load power while operating within the allowed switching frequency bandwidth.

Figure 8:
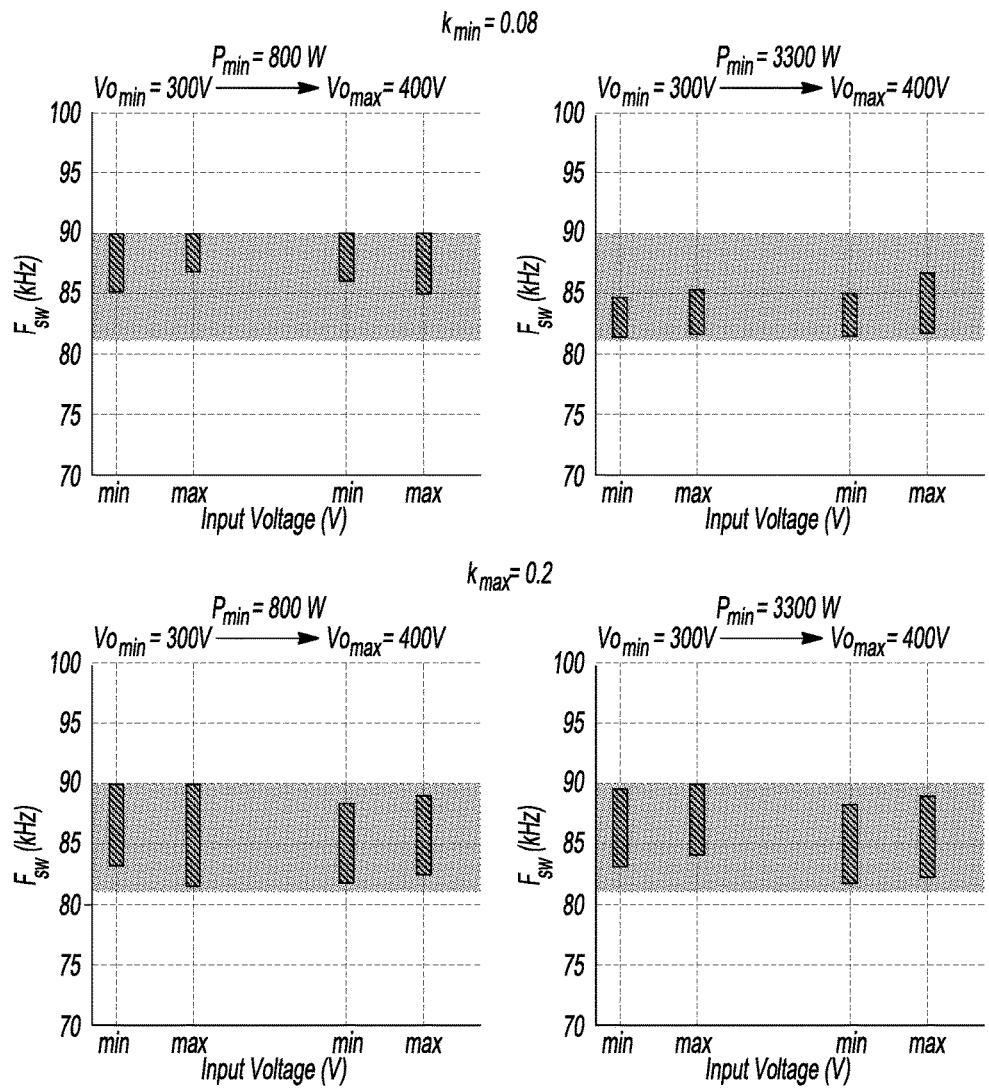
FIG. 8 shows plots of switching frequency as a function of input voltage associated with a SS-L compensation network at a minimum power of 800 W and a maximum power of 3,300 W for a kmin of 0.08 and a kmax of 0.2.

An optimization code was created to search for Cp and Cs optimal values. FIG. 8 shows the switching frequency range for all possible designs. All possible combinations for Cp and Cs that were recommended by the optimization code allow for power regulation while operating within the allowed switching frequency bandwidth.

Figure 9:
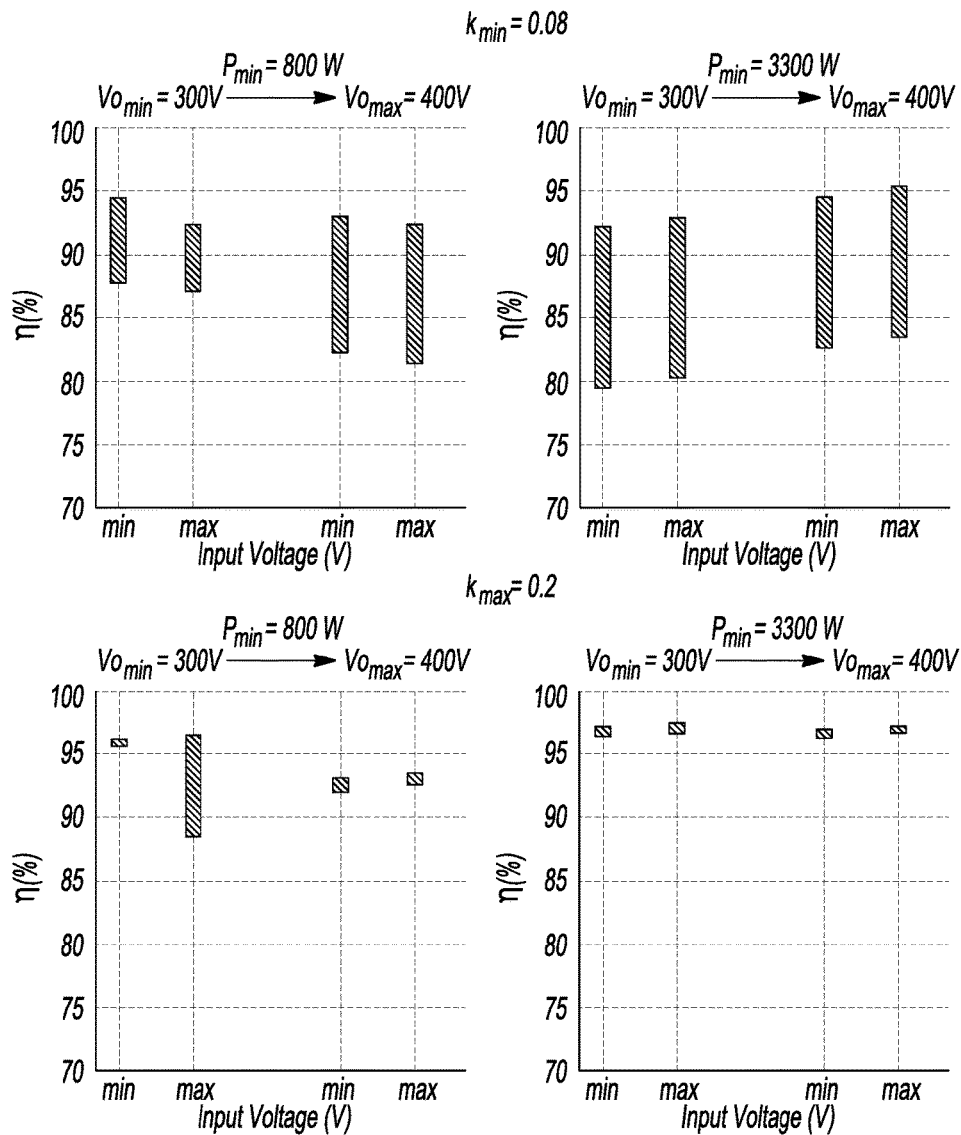
FIG. 9 shows plots of coupler efficiency as a function of input voltage associated with a SS-L compensation network at a minimum power of 800 W and a maximum power of 3,300 W for a kmin of 0.08 and a kmax of 0.2.

Although higher current circulation was realized in the secondary coil, the SS-L implementation yields a more efficient system at low coupling as shown in FIG. 9. This is because current circulation in the primary coil is reduced by almost half. That is, the SS-L compensation network is not only successful in achieving the bandwidth, but also guarantees 80% efficiency under all operating conditions. Maximum coupling can achieve more than 90% efficiency.

One design was characterized in more detail. This design yields values for Cp, Cs, and Lb to be 7.6 nF, 17 nF, and 40 μH, respectively. It is assumed that the IPT system is directly connected to a battery and the battery voltage changes linearly from 300 V to 400 V as the battery charges from its minimum SOC to maximum SOC. A summary of results for this design is shown in FIG. 10.

Figure 10:
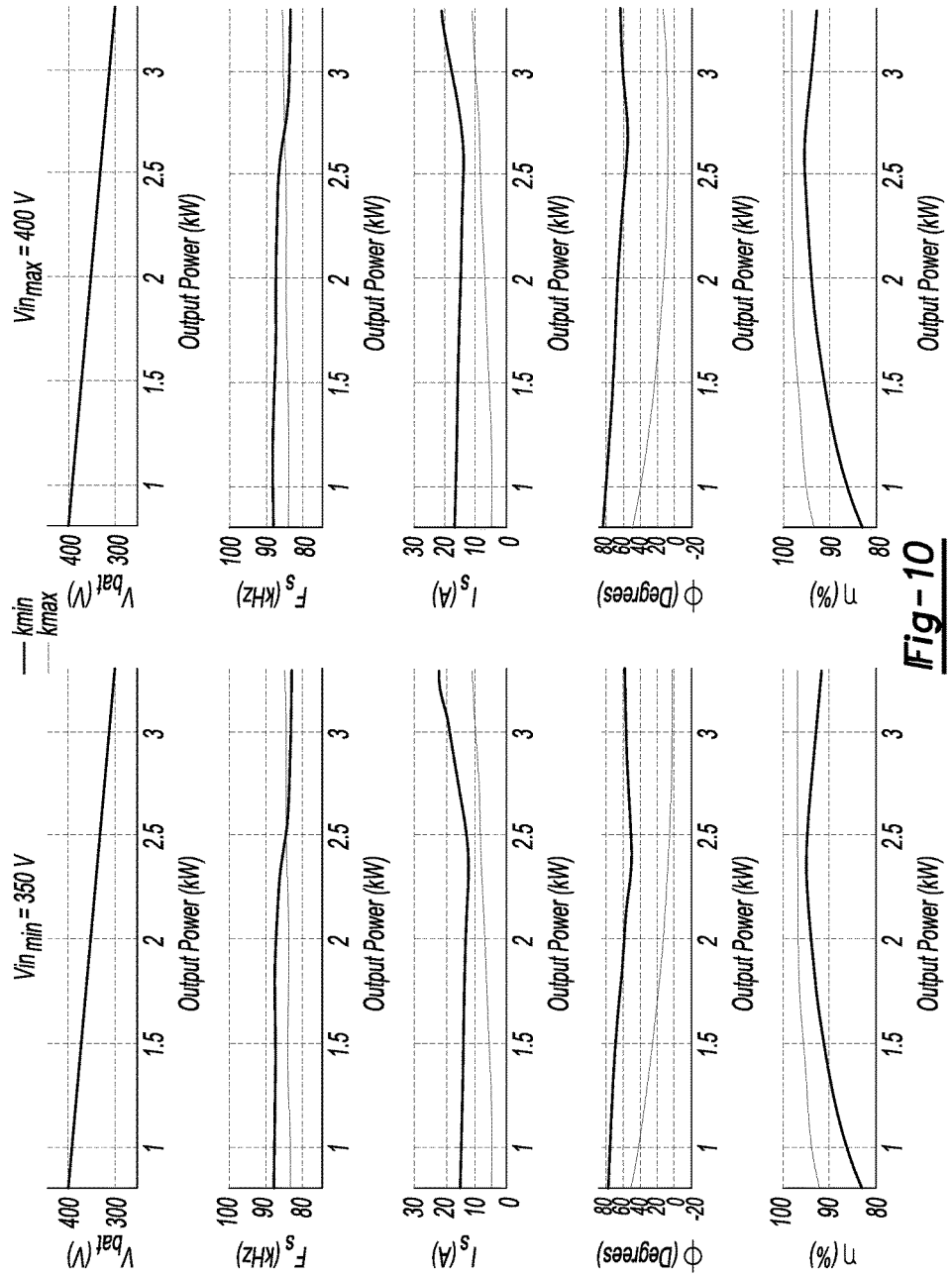
FIG. 10 shows plots of coupler efficiency, input impedance phase angle, primary coil current, switching frequency, and output voltage associated with a SS-L compensation network as a function of output power at a minimum input voltage of 350 V and a maximum input voltage of 400 V for kmin and kmax values.
Figure 11:
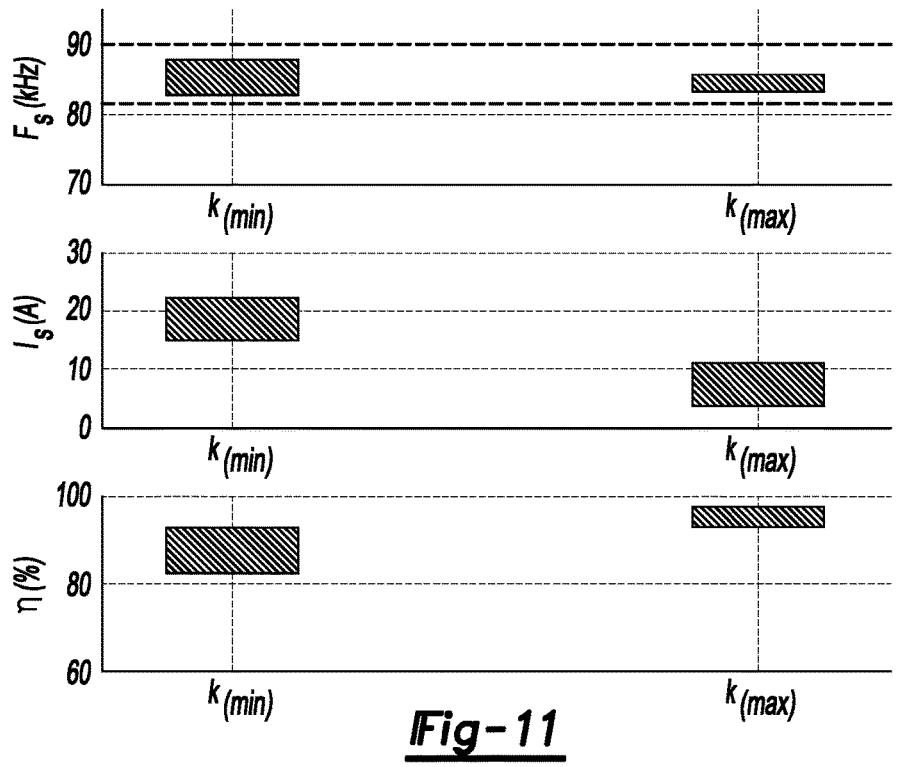
FIG. 11 shows plots of coupler efficiency, primary coil current, and switching frequency associated with a SS-L compensation network for kmin and kmax values.

FIG. 10 shows a comprehensive study for the IPT system as the output power varies from its minimum value (800 W) to its maximum value (3.3 kW). It can be seen that at high coupling coefficient the switching frequency is almost constant. And at minimum coupling coefficient, the switching frequency starts to reduce as the power transfer increases. In both coupling cases the switching frequency is always within the allowed bandwidth. It is worth mentioning that the primary coil current (Is) is below 22 A for all operating conditions. When the input voltage is at its minimum, the input impedance phase angle is negative and thus ZVS operation is lost. If the value of Lb is increased, ZVS operation at the minimum input voltage is guaranteed. This comes at the expense of increased current circulation in the primary coil and slight reduction in efficacy. A summary for this example design is shown in FIG. 11.

Figure 12:
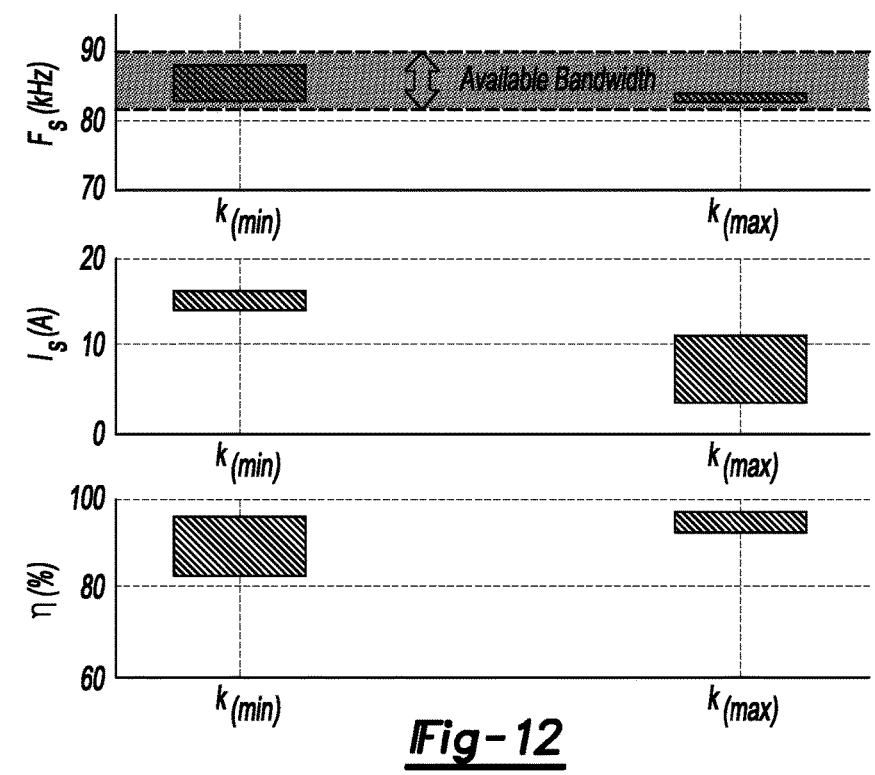
FIG. 12 shows plots of coupler efficiency, primary coil current, and switching frequency associated with a SS-L compensation network for kmin and kmax values when an impedance converter is used.

In order to understand the benefit of an impedance converter (on-board charger), another study was carried out by fixing the WPT output voltage to be 400V for all operating conditions. FIG. 12 summarizes the system performance under this condition. Efficiency is increased at low coupling case and current circulation in the primary coil is less than 16 A.

To generalize the benefits of the proposed solution, analytical expressions of the input impedance for both the SS compensation network and the proposed SS-L compensation network are given in equations (2) and (3), respectively:

$$Z_{in} = Rp - \frac{i}{\omega Cp} + \omega Lpi + \frac{\omega^2 M^2}{R_e + Rs - \frac{i}{\omega Cs} + \omega Lsi} \quad (2)$$

$$Z_{in} = \frac{-\frac{\frac{i}{\omega Cp} - \omega(Lp-M)i}{\sigma_2} + \frac{i}{\omega L_b} + \frac{\omega M i}{\sigma_2}}{\sigma_1} + \frac{\omega^2 M^2}{\left(R_e - \frac{\frac{i}{\omega Cs} - \omega(Ls-M)i}{\sigma_2} - \frac{\omega M i}{\sigma_2}\right)\sigma_1^2 \sigma_2^2} \quad (3)$$

where $$\sigma_1 = \left(\frac{\frac{1}{\omega Cs} - \omega(Ls-M)i}{\sigma_2} - \frac{\omega M i}{\sigma_2}\right)\left(-\frac{\frac{i}{\omega Cp} - \omega(Lp-M)i}{\sigma_2}\right) + \left(\frac{i}{\omega L_b} + \frac{\omega M i}{\sigma_2}\right) - \frac{\omega^2 M^2}{\sigma_2^2}$$

$$\sigma_2 = \left(\frac{1}{\omega Cp} - \omega(Lp-M)i\right)\left(\frac{i}{\omega Cs} - \omega(Ls-M)i\right) + \omega M\left(\frac{i}{\omega Cp} - \omega(Lp-M)i\right) + \omega M\left(\frac{i}{\omega Cs} - \omega(Ls-M)i\right)i$$

M is the mutual inductance, Lp is the ground side self-inductance, Ls is the secondary side self-inductance, $R_e$ is the reflected load resistance loading the resonant tank network, $C_p$ is the series compensation capacitor connected in the ground side, $C_s$ is the series compensation capacitor connected in the vehicle side, $L_b$ is the parallel compensation inductor connected in the vehicle side, $\omega$ is the angular switching frequency, $R_p$ is the resistance formed by the ground side coil, and $R_s$ is the resistance formed by the vehicle side coil.

Figure 13:
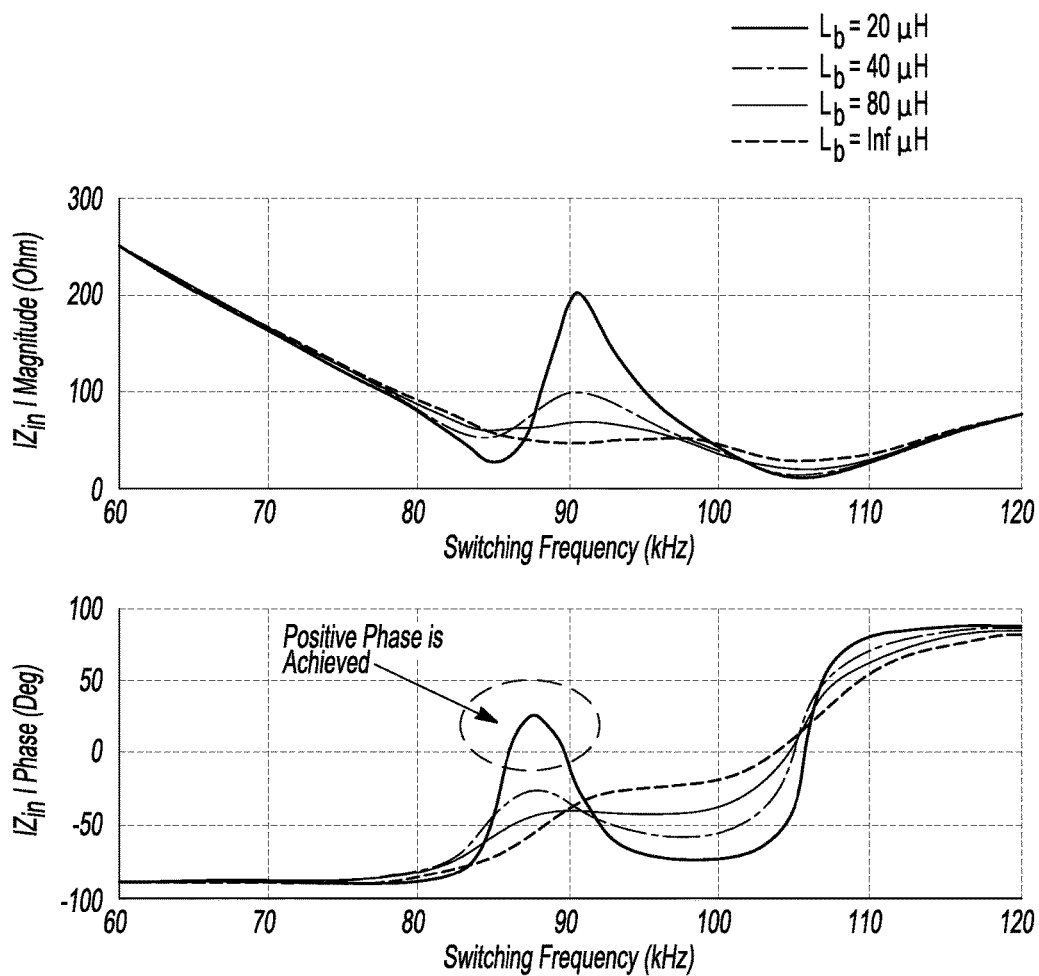
FIG. 13 shows plots of input impedance (magnitude and phase) for a SS-L compensation network.

In order to investigate the contribution of the inductor 742, equation (3) is evaluated numerically and plotted (magnitude and phase) in FIG. 13. By taking the limit of the input impedance in equation (3) as Lb goes to infinity, this expression simplifies to equation (2). This result is intuitive since increasing the inductance of the inductor 742 to infinity simplifies the SS-L circuit to the SS circuit. The power transfer expression shown in equation (1) indicates that not only the magnitude of the input impedance controls the level of power transfer at an explicit switching frequency but also the cosine of its phase has a major contribution too. These observations should be noted when attempting to understand the unexpected contribution of the inductor 742.

One design was characterized in more detail. This design yields values for Cp, Cs, and $L_b$ of 6.48 nF, 16.2 nF, and 20 µH, respectively. The compensation capacitors are tuned to minimize the VA circulation in the couplers while allowing the inverter's switching frequency to be within the regulatory bandwidth. This optimization was performed while considering the impedance of the inductor 742. It can be shown in FIG. 8 that when the inductor 742 has infinite impedance (SS configuration), the input impedance phase is less than zero and thus operating the inverter is not achievable within the regulatory switching frequency bandwidth. The inductor impedance introduces phase lag to the input impedance and thus allows its phase to be greater than zero within the desired frequency range. That is, the phase of the input impedance is positive (the input impedance is inductive) over a range of frequencies. For frequencies adjacent to and on both sides of this range, the phase in negative (the input impedance is capacitive). This allows the inverter to achieve zero voltage switching.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle comprising:
an inductor in parallel with a load and a series connected secondary coil and capacitor, and having an impedance such that the secondary coil achieves resonance at a predetermined frequency with a primary coil during wireless power transfer, the primary coil forming a portion of a primary charge circuit including a capacitor in series with the primary coil and the impedance being such that an input impedance to the primary charge circuit is inductive at the predetermined frequency.

2. The circuit of claim 1, wherein the input impedance is inductive over a range of frequencies including the predetermined frequency and capacitive for frequencies adjacent to and on both sides of the range.

3. The circuit of claim 2, wherein the range includes 81 to 90 kHz.

4. The circuit of claim 1, wherein a capacitance of the capacitor is based on the impedance.

5. A secondary side wireless power transfer compensation circuit comprising:
a secondary coil;
a capacitor in series with the secondary coil; and
an inductor in parallel with the secondary coil and capacitor, and having an impedance matching a reflected impedance of a load in parallel with the inductor such that the secondary coil achieves resonance with a primary coil coupled therewith at a predetermined frequency that depends on the impedance.

6. The circuit of claim 5, wherein the primary coil forms a portion of a primary charge circuit including a capacitor in series with the primary coil and wherein the impedance is such that an input impedance to the primary charge circuit is inductive.

7. The circuit of claim 6, wherein the input impedance is inductive over a range of frequencies including the predetermined frequency and capacitive for frequencies adjacent to and on both sides of the range.

8. The circuit of claim 7, wherein the range includes 81 to 90 kHz.

9. The circuit of claim 5, wherein a capacitance of the capacitor is based on the impedance.

10. A vehicle comprising:
a secondary coil, a capacitor, and an inductor arranged such that, during wireless power transfer from a primary coil to the secondary coil, the secondary coil, capacitor, and inductor form a portion of a SS-L compensation network;
a traction battery configured to receive power from the secondary coil; and
an electric machine configured to receive power from the traction battery.

11. The vehicle of claim 10, wherein the capacitor is in series with the secondary coil and wherein the inductor is in parallel with the capacitor and secondary coil.

12. The vehicle of claim 10, wherein the inductor has an impedance matching a reflected impedance of a load electrically connected across the inductor such that the secondary coil achieves resonance with the primary coil during the wireless power transfer at a predetermined frequency that depends on the impedance.

13. The vehicle of claim 12, wherein the predetermined frequency falls within a range of 81 to 90 kHz.

14. The vehicle of claim 12, wherein the primary coil forms a portion of a primary charge circuit including a capacitor in series with the primary coil and wherein the impedance is such that an input impedance to the primary charge circuit is inductive.

15. The vehicle of claim 14, wherein the input impedance is inductive over a range of frequencies and capacitive for frequencies adjacent to and on both sides of the range.

16. The vehicle of claim 10, wherein a capacitance of the capacitor is based on an impedance of the inductor.

* * * * *